(12) United States Patent
Levy et al.

(10) Patent No.: US 7,691,666 B2
(45) Date of Patent: Apr. 6, 2010

(54) METHODS OF MAKING THIN FILM TRANSISTORS COMPRISING ZINC-OXIDE-BASED SEMICONDUCTOR MATERIALS AND TRANSISTORS MADE THEREBY

(75) Inventors: David H. Levy, Rochester, NY (US); Andrea C. Scuderi, Rochester, NY (US); Lyn M. Irving, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 699 days.

(21) Appl. No.: 11/155,436

(22) Filed: Jun. 16, 2005

(65) Prior Publication Data

US 2006/0284171 A1    Dec. 21, 2006

(51) Int. Cl.
H01L 21/00 (2006.01)
H01L 21/16 (2006.01)

(52) U.S. Cl. .............................. 438/104; 257/E21.464; 257/43

(58) Field of Classification Search ............... 438/149, 438/104; 257/E21.094, E21.104, E21.121, 257/E21.372, E21.411, E21.412, E21.413, 257/E21.414, E21.415, E21.416, E21.464, 257/43
See application file for complete search history.

(56) References Cited

U.S. PATENT DOCUMENTS 5,371,026 A * 12/1994 Hayden et al. .............. 438/275

2004/0127038 A1    7/2004 Carcia et al.
2004/0141041 A1 *  7/2004 Tsutsumi et al. ............ 347/102
2006/0220023 A1 * 10/2006 Hoffman et al. .............. 257/72
2006/0228887 A1 * 10/2006 Thirukkovalur et al. ..... 438/674

FOREIGN PATENT DOCUMENTS

EP    1 324 398 A2    2/2003
JP    2004349583    9/2004

OTHER PUBLICATIONS

Hilgendorff et al., "From ZnO Colloids to Nanocrystalline Highly Conductive Films", J. Electrochem. Soc. vol. 145, No. 10, Oct. 1998, pp. 3632-3637.*
J.H.Lee, et al., "substrate effect on the growth of well-aligned ZnO nanorod arrays from aqueous solution," Journal of Crystal Growth 275 (2005) e2069-2075.
Lei Z. Zhang, et al., "Preparation, characterization and optical properties of nanostructured ZnO thin films," Optical Materials 27 (2004) 217-220.
Z.Q. Xu, et al., "Characteristics of Al-doped c-axis orientation ZnO thin films prepared by the sol-gel method," Materials Research Bulletin 41 (2006) 354-358).
Steven K. volkman et al., "A novel transparent air-stable printable n-type semiconductor technology using ZnO nanoparticles," 2004 IEEE International Electron Device meeting, Technical Digest, pp. 769, 2004.

* cited by examiner

Primary Examiner—W. David Coleman
Assistant Examiner—Sonya D McCall-Shepard
(74) Attorney, Agent, or Firm—J. Lanny Tucker

(57) ABSTRACT

A thin film transistor comprises a zinc-oxide-containing semiconductor material. Such transistors can further comprise spaced apart first and second contact means or electrodes in contact with said material. Further disclosed is a process for fabricating a thin film transistor device, wherein the substrate temperature is no more than 300° C. during fabrication.

44 Claims, 4 Drawing Sheets

METHODS OF MAKING THIN FILM TRANSISTORS COMPRISING ZINC-OXIDE-BASED SEMICONDUCTOR MATERIALS AND TRANSISTORS MADE THEREBY

FIELD OF THE INVENTION

The present invention relates to the use of zinc-oxide-based semiconductor materials in semiconductor films for thin film transistors. Such thin film transistors can be used in electronic devices, particularly in displays in which solution processable semiconductor materials, and low temperature processes of making the same, are advantageous.

BACKGROUND OF THE INVENTION

Thin film transistors (TFTs) are widely used as switching elements in electronics, for example, in active-matrix liquid-crystal displays, smart cards, and a variety of other electronic devices and components thereof. The thin film transistor (TFT) is an example of a field effect transistor (FET). The best-known example of an FET is the MOSFET (Metal-Oxide-Semiconductor-FET), today's conventional switching element for high-speed applications. For applications in which a transistor needs to be applied to a substrate, a thin film transistor is typically used. A critical step in fabricating the thin film transistor involves the deposition of a semiconductor onto the substrate. Presently, most thin film devices are made using vacuum deposited amorphous silicon as the semiconductor.

Amorphous silicon as a semiconductor for use in TFTs still has its drawbacks. The deposition of amorphous silicon, during the manufacture of transistors, requires relatively difficult or complicated processes such as plasma enhanced chemical vapor deposition and high temperatures (about 360° C.) to achieve the electrical characteristics sufficient for display applications. Such high processing temperatures disallow deposition on substrates made of certain plastics that might otherwise be desirable for use in applications such as flexible displays. Furthermore, vacuum deposition of semiconductors typically continuously cover a substrate, requiring subsequent subtractive patterning steps. These patterning steps are time consuming and waste materials.

There is a growing interest in depositing thin film semiconductors on plastic or flexible substrates, particularly because these supports would be more mechanically robust, lighter weight, and potentially lead to cheaper manufacturing by allowing roll-to-roll processing. A useful example of a flexible substrate is polyethylene terephthalate. Such plastics, however, limit device processing to below 200° C.

In the past decade, various materials have received attention as a potential alternative to amorphous silicon for use in semiconductor channels of thin film transistors. Semiconductor materials are desirable that are simpler to process, especially those that are soluble in organic or aqueous solvents and, therefore, capable of being applied to large areas by relatively simple processes, such as spin coating, dip coating, microcontact printing, or ink jet application. Semiconductor materials that can be deposited at lower temperatures would open up a wider range of substrate materials, including plastics, for flexible electronic devices. Furthermore, additive solution processes have the opportunity to reduce materials cost by only applying semiconductor materials where they are needed.

Thus, thin film transistors made of coatable semiconductor materials can be viewed as a potential key technology for circuitry in various electronic devices or components such as display backplanes, portable computers, pagers, memory elements in transaction cards, and identification tags, where ease of fabrication, mechanical flexibility, and/or moderate operating temperatures are important considerations.

This, in turn, has fueled an interest in discovering new semiconductor materials. Organic semiconductors comprise one broad class of low-temperature alternative semiconductor materials that have been the subject of considerable research efforts. However, most organic semiconductors generally have inferior or problematic electronic properties compared to amorphous silicon for use in transistor devices. For example, organic materials may tend to degrade in normal atmospheric conditions. In contrast, inorganic semiconductors tend to be more stable. Consequently, an inorganic semiconductor that is compatible with temperature-sensitive substrates and that has electronic properties equivalent to amorphous silicon would enable electronics for a variety of flexible substrates.

The discovery of new inorganic semiconductors has also been the subject of considerable research efforts. For example, metal oxide semiconductors are known that constitute zinc oxide, indium oxide, tin oxide, or cadmium oxide deposited with or without additional doping elements including transition metals such as aluminum. Such semiconductor materials, which are transparent, can have an additional advantage for certain applications, as discussed below.

Various processes for making zinc oxide films have been disclosed, both high temperature and low temperature processes, including radio-frequency magnetron sputtering or modified reactive planar magnetron sputtering.

Ohya et al (Japanese Journal of Applied Physics, Part 1, January 2001, vol. 40, no. 1, pages 297-8 disclose a thin film transistor of ZnO fabricated by chemical solution deposition.

Transparent conducting oxides are reviewed in the August 2000 issue of the Materials Research Bulletin, Volume 25 (8) 2000, devoted to materials and properties of transparent conducting oxide compounds.

One low temperature process for deposition of such oxide semiconductors are disclosed in US 2004/0127038 A1 to Carcia et al. This patent discloses a semiconductor deposition process that uses magnetron sputtering of a metal oxide (ZnO, $In_2O_3$, $SnO_2$, CdO) or metal (Zn, In, Sn, Cd) target in an atmosphere with a controlled partial pressure of oxygen in an inert gas. This is a low temperature process that is compatible with temperature sensitive substrates and components, for example, drive circuits for displays on flexible, polymer substrates. The field effect transistors of Carcia et al. are based on a nominally undoped metal oxide semiconductor that must be deposited using physical vapor deposition or chemical vapor deposition, preferably rf (radio frequency) magnetron sputtering.

Japanese Kokai JP2004349583 A1 discloses a method of producing a thin film transistor in which a dispersion of zinc-oxide nanoparticles is ink-jetted to form the semiconducting channel. No actual examples, however, are described relating to the preparation of the dispersion.

US 2004/0127038 discloses a method to produce high quality zinc-oxide thin film transistors using sputtering as a vacuum deposition method.

Steven K. Volkman et al., "A novel transparent air-stable printable n-type semiconductor technology using ZnO nanoparticles," 2004 IEEE International Electron Device meeting Technical Digest, pp. 769, 2004, discloses a method for producing thin film transistors using organically stabilized zinc-oxide nanoparticles. The disclosed process involves a exposure to a temperature of 400° C.

Transparent oxide semiconductors are especially useful in the fabrication of transparent thin film transistors. Such transparent transistors can be used to control pixels in a display. By being transparent, the active area of the transistor can be significantly increased.

For example, thin film transistors are employed in active-matrix liquid crystal displays (AMLCD), which are extensively used in laptop computers and other information display products. The operation of an AMLCD display requires that each picture or display element (pixel) have a corresponding thin film transistor associated with it for selecting or addressing the pixel to be on or off ("pixel driver"). Presently, AMLCD displays employ transistor materials that may be deposited onto glass substrates but are not transparent (typically amorphous, polycrystalline, or continuous-grain silicon deposited on glass). The portion of the display glass occupied by the addressing electronics is not available for transmission of light through the display. Transparent transistors for AMLCD addressing would allow greater light transmission through the display, thereby improving display performance.

Semiconductor materials for use in thin film transistors in various electronic devices may require significant mobilities, well above 0.01 $cm^2/Vs$, and current on/off ratios (hereinafter referred to as "on/off ratios") greater than 1000.

Semiconductor materials include "p-type" or "p-channel" semiconductors, meaning that negative gate voltages, relative to the source voltage, are applied to induce positive charges (holes) in the channel region of the device. An alternative to p-type semiconductor materials are "n-type" or "n-channel" semiconductor materials, which terminology indicates that positive gate voltages, relative to the source voltage, are applied to induce negative charges in the channel region of the device. Thus, in an n-type TFT, the device can be turned on, by applying a more positive voltage.

SUMMARY OF THE INVENTION

This invention relates to a method for preparing a zinc-oxide-based semiconductor film employing zinc-oxide-based nanoparticles. A leading use of the semiconductor films of the present invention is for thin film transistors. In a preferred embodiment, the zinc-oxide-based semiconductor materials are "n-type," although, through the use of suitable dopants, p-type materials are also envisioned. The zinc-oxide-based semiconductor material can contain other metals capable of forming semiconducting oxides such as indium, tin, or cadmium, and combinations thereof. Minor amounts of acceptor dopants can also be included.

The method of making a thin film comprising a zinc-oxide-based semiconductor comprises:

(a) applying, to a substrate, a seed coating comprising a colloidal solution of zinc-oxide-based nanoparticles having an average primary particle size of 5 to 200 nm;

(b) drying the seed coating to form a porous layer of zinc-oxide-based nanoparticles;

(c) optionally annealing the porous layer of zinc-oxide-based nanoparticles at a temperature higher than the temperature of step (a) or (b);

(d) applying, over the porous layer of nanoparticles, an overcoat solution comprising a soluble zinc-oxide-precursor compound that converts to zinc oxide upon annealing, to form an intermediate composite film;

(e) drying the intermediate composite film;

(f) annealing the dried intermediate composite film at a temperature of at least 50° C. to produce a semiconductor film comprising zinc-oxide-based nanoparticles supplemented by additional zinc oxide material formed by the conversion of the zinc-oxide-precursor compound during the annealing of the composite film.

One embodiment of the present invention is directed to a process for fabricating a thin film transistor, preferably by solution-phase deposition of the n-channel semiconductor film onto a substrate, preferably wherein the substrate temperature is at a temperature of no more than 300° C. during the deposition. In one embodiment, the nanoparticles are applied at room temperature followed by an annealing step carried out, typically, for one hour or less at a substrate temperature of 300° C. or less. Laser annealing may also be employed to allow the semiconductor to reach higher temperatures while maintaining relatively low substrate temperatures.

The invention is also directed to a transistor comprising a zinc-oxide-based semiconductor, preferably on a flexible substrate, made by the present process.

Semiconductor films made by the present method are capable of exhibiting, in the film form, excellent field-effect electron mobility of greater than 0.01 $cm^2/Vs$ and on-off ratios of greater than $10^4$, in which performance properties are sufficient for use in a variety of relevant technologies, including active matrix display backplanes.

A TFT structure includes, in addition to the zinc-oxide-based semiconductor, conducting electrodes, commonly referred to as a source and a drain, for injecting a current into the zinc-oxide-based semiconductor. One embodiment of the present invention is directed to the use of such n-channel semiconductor films in thin film transistors each comprising spaced apart first and second contact means connected to an n-channel semiconductor film. A third contact means can be spaced from said semiconductor film by an insulator, and adapted for controlling, by means of a voltage applied to the third contact means, a current between the first and second contact means through said film. The first, second, and third contact means can correspond to a drain, source, and gate electrode in a field effect transistor.

BRIEF DESCRIPTION OF THE DRAWINGS

The above and other objects, features, and advantages of the present invention will become more apparent when taken in conjunction with the following description and drawings wherein identical reference numerals have been used, where possible, to designate identical or analogous features that are common to the figures, and wherein.

DETAILED DESCRIPTION OF THE INVENTION

Figure 1:
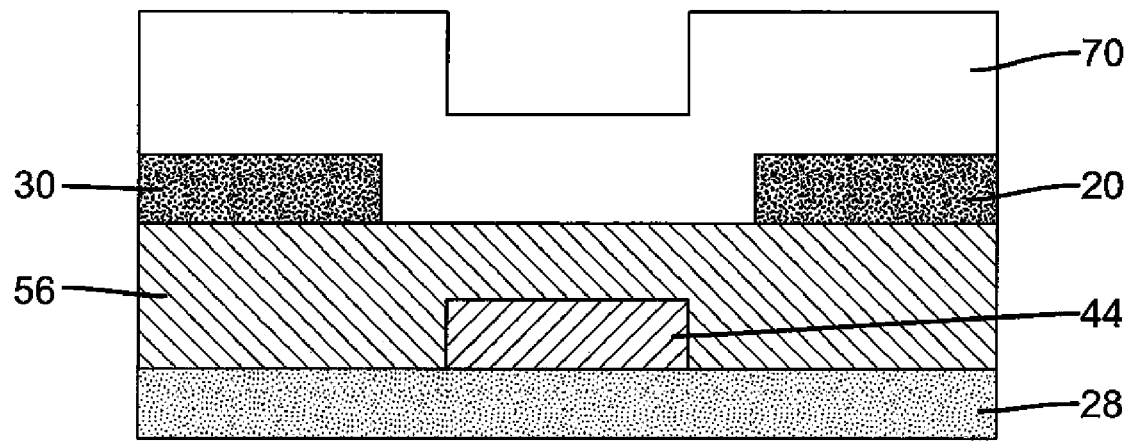
FIG. 1 illustrates a cross-sectional view of a typical thin film transistor having a bottom-gate/bottom-contact configuration.

The semiconductor films made according to the present method exhibit a field effect electron mobility that is greater than 0.01 cm$^2$/Vs, preferably at least 0.1 cm$^2$/Vs, more preferably greater than 0.2 cm$^2$/Vs. In addition, n-channel semiconductor films made according to the present invention are capable of providing on/off ratios of at least 10$^4$, advantageously at least 10$^5$. The on/off ratio is measured as the maximum/minimum of the drain current as the gate voltage is swept from one value to another that are representative of relevant voltages which might be used on the gate line of a display. A typical set of values would be −10V and 40V with the drain voltage maintained at 30V.

The thin film semiconductors made by the present method have the advantage of maintaining these performance properties even when the materials used in the manufacture of the thin film semiconductors, or the thin film semiconductors themselves, are exposed to air.

One embodiment of the present method of making a thin film comprising a zinc-oxide-based semiconductor comprises:

A method of making a zinc-oxide-based thin film semiconductor, for use in a transistor, comprising:

(a) applying, to a substrate, a seed coating comprising a colloidal solution of zinc-oxide-based nanoparticles having an average primary particle size of 5 to 200 nm;

(b) drying the seed coating to form a porous layer of zinc-oxide-based nanoparticles;

(c) optionally annealing the porous layer of zinc-oxide-based nanoparticles at a temperature higher than the temperature of step (a) or (b), at a temperature of 50 to 500° C., preferably 100 to 250° C.;

(d) applying, over the porous layer of nanoparticles, an overcoat solution comprising a soluble zinc-oxide-precursor compound that converts to zinc oxide upon annealing, to form an intermediate composite film;

(e) drying the intermediate composite film; and (f) annealing the dried intermediate composite film at a temperature of at least 50° C., suitably up to 500° C., to produce a semiconductor film comprising zinc-oxide-based nanoparticles supplemented by additional zinc oxide material formed by the conversion of the zinc-oxide-precursor compound during the annealing of the composite film.

Preferably, the seed coating is applied to the substrate at a level of 0.02 to 1 g/m$^2$ of nanoparticles, by dry-weight. The overcoat solution is preferably applied at a level of 2×10$^{-4}$ to 0.01 moles/m$^2$ of precursor compound. In a preferred embodiment, the molar ratio of nanoparticles to theoretically converted zinc-oxide precursor compound is approximately 0.02 to 60, based on moles of ZnO and precursor compound present.

The seed coating and the overcoat can be applied by various methods, including conventional coating techniques for liquids. In one embodiment, the seed coating and/or the overcoat solution is applied using an inkjet printer. The inkjet printer can be a continuous or drop-on-demand inkjet printer. In a conventional inkjet printer, the method of inkjet printing a semiconductor film on a substrate element typically comprises: (a) providing an inkjet printer that is responsive to digital data signals; (b) loading a first printhead with the seed solution; (c) printing on the substrate using the seed solution in response to the digital data signals; (d) loading a second printhead with the overcoat solution (e) printing over the first coating using the overcoat solution in response to the digital data signals; and (f) annealing the printed substrate.

Other coating techniques include spin coating, extrusion coating, hopper coating, dip coating, or spray coating. In a commercial scale process, the semiconductor film can be coated on a web substrate which is later divided into individual semiconductor films. Alternately, an array of semiconductor films can be coated on a moving web.

For example, a layer of zinc-oxide-based nanoparticles may be applied by spin coating and subsequently annealed for about 10 seconds to 10 minute, preferably 1 minute to about 5 minutes in certain instances, at a temperature of about 50 to 500° C., preferably about 130C to about 300° C., suitably in an ambient environment.

A semiconductor material, for use in an atmospheric process, must display several characteristics. In typical applications of a thin film transistor, the desire is for a switch that can control the flow of current through the device. As such, it is desired that when the switch is turned on a high current can flow through the device. The extent of current flow is related to the semiconductor charge carrier mobility. When the device is turned off, it is desired that the current flow be very small. This is related to the charge carrier concentration. Furthermore, it is desired that the device be weakly or not at all influenced by visible light. In order for this to be true, the semiconductor band gap must be sufficiently large (>3 eV) so that exposure to visible light does not cause an inter-band transition. A material that capable of yielding a high mobility, low carrier concentration, and high band gap is ZnO. Furthermore, in a real high volume web based atmospheric manufacturing scheme, it is highly desirable that the chemistries used in the process be both cheap and of low toxicity, which can be satisfied by the use of ZnO and the majority of its precursors.

As indicated above, the present method of making the zinc-oxide-based semiconductor thin film, for use in thin film transistors, employs nanoparticles of a zinc-oxide-based material. The zinc-oxide-based semiconductor material can contain minor amounts of other metals capable of forming semiconducting oxides such as indium, tin, or cadmium, and combinations thereof. For example, Chiang, H. Q. et al., "High mobility transparent thin-film transistors with amorphous zinc tin oxide channel layer," Applied Physics Letters 86, 013503 (2005) discloses zinc tin oxide materials. Also, minor amounts of optional acceptor or donor dopants, preferably less than 10 weight percent, can also be included in the nanoparticles before or after deposition.

Accordingly, the term "zinc-oxide-based" refers to a composition comprising mostly zinc oxide, preferably at least 80 percent, but allowing additives or mixtures with minor amounts of other metal oxides, which semiconductor compositions are known to the skilled artisan.

Although undoped zinc-oxide-based nanoparticles can be employed in the present invention, the resistivity of the ZnO may be enhanced by substitutional doping with an acceptor dopant such as, for example, N, B, Cu, Li, Na, K, Rb, P, As, and mixtures thereof. Alternatively, p-type zinc-oxide films can be achieved, by the use of various p-type dopants and doping techniques. For example, U.S. Pat. No. 6,610,141 B2 to White et al. discloses zinc-oxide films containing a p-type dopant, for use in LEDs (light emitting devices), LDs (laser diodes), photodetectors, solar cells or other electrical devices where both n-type and p-type materials may be required for one or more multiple p-n junctions. White et al. employ diffusion of arsenic from a GaAs substrate to produce an arsenic-doped zinc-oxide-based film. U.S. Pat. No. 6,727,522 B1 also describes various dopants for p-type zinc-oxide-based semiconductor films, in addition to n-type dopants. Electrical devices in which zinc oxide is used as the n-type semiconductor and a different metal oxide, such as copper oxide or sodium cobalt oxide, is used as a p-type metal oxide are also known, as for example, described in EP 1324398 A2. Thus, the present invention can be used to make one or more semiconductor thin films in the same electrical device having a p-n junction, either by variously doped zinc-oxide-based semiconductor thin films made by the present method or by a zinc-oxide-based semiconductor thin film in combination with one or more other metal-oxide semiconductor thin films known in the art. For example, an electrical device made according to the present invention can include a p-n junction formed using a zinc-oxide-based thin film semiconductor made by the present method in combination with a thin film semiconductor of complementary carrier type as known in the art.

The thickness of the channel layer may vary, and according to particular examples it can range from about 5 nm to about 100 nm. The length and width of the channel is determined by the pixel size and the design rules of the system under construction. Typically, the channel width may vary from 10 to 1000 µm. The channel length may vary, and according to particular examples it can range from about 1 to about 100 µm.

The entire process of making the thin film transistor or electronic device of the present invention, or at least the production of the thin film semiconductor, can be carried out below a maximum support temperature of about 500° C., more preferably below 250° C., most preferably below about 150° C., and even more preferably below about 100° C., or even at temperatures around room temperature (about 25° C. to 70° C.). The temperature selection generally depends on the support and processing parameters known in the art, once one is armed with the knowledge of the present invention contained herein. These temperatures are well below traditional integrated circuit and semiconductor processing temperatures, which enables the use of any of a variety of relatively inexpensive supports, such as flexible polymeric supports. Thus, the invention enables production of relatively inexpensive circuits containing thin film transistors with significantly improved performance.

One embodiment of the present invention is directed to a process for fabricating a thin film transistor, preferably by solution-phase deposition of the semiconductor thin film onto a substrate, preferably wherein the substrate temperature is at a temperature of no more than 300° C. during the deposition. In such an embodiment, the nanoparticles are applied at room temperature followed by an annealing step carried out, typically, for one hour or less at a substrate temperature of 300° C. or less. Laser annealing may also be employed to allow the semiconductor to reach higher temperatures while maintaining relatively low substrate temperatures.

The nanoparticles used in the present invention can be formed as a colloidal sol for application to the substrate. Preferably, nanoparticles having an average primary particles size of 5 to 200 nm, more preferably from 20 to 100150, are colloidally stabilized in the coating solution, by charge, in the absence of surfactant. Charge stabilized sols are stabilized by repulsion between particles based on like surface charges. See C. Jeffrey Brinker and George W. Scherer, *The Physics and Chemistry of Sol-Gel Processing*, Academic Press (New York 1989).

Zinc-oxide-based nanoparticles can be formed from the reaction of an organometallic precursor such as zinc acetate that is hydrolyzed with a base such as potassium hydroxide. Other organometallic precursor compounds can include, for example, zinc acetylacetonate, zinc formate, zinc hydroxide, zinc chloride, zinc nitrate, their hydrates, and the like. Preferably, the organometallics precursor compound is a zinc salt of a carboxylic acid or a hydrate thereof, more preferably zinc acetate or a hydrate thereof. Optional doping materials can include, for example, aluminum nitrate, aluminum acetate, aluminum chloride, aluminum sulfate, aluminum formate, gallium nitrate, gallium acetate, gallium chloride, gallium formate, indium nitrate, indium acetate, indium chloride, indium sulfate, indium formate, boron nitrate, boron acetate, boron chloride, boron sulfate, boron formate, and their hydrates.

Preferably, after particle formation, the level of ions are reduced by washing to obtain a stable dispersion. Too many ions in solution can cause a screening of the particles from each other so that the particles approach too closely leading to aggregation and thus poor dispersion. Repeated washings allow the inorganic ion level to reach a preferred concentration of below 1 mM. Preferably, the level of organic compounds, or salts thereof, is maintained below a level of 5 mM.

Another aspect of the invention relates to the process for the production of semiconductor components and electronic devices incorporating such components.

In one embodiment, a substrate is provided and a layer of the semiconductor material as described above can be applied to the substrate, electrical contacts being made to the layer. The exact process sequence is determined by the structure of the desired semiconductor component. Thus, in the production of a field effect transistor, for example, a gate electrode can be first deposited on a flexible substrate, for example a vacuum or solution deposited metal or organic conductor. The gate electrode can then be insulated with a dielectric and then source and drain electrodes and a layer of the n-channel semiconductor material can be applied on top. The structure of such a transistor and hence the sequence of its production can be varied in the customary manner known to a person skilled in the art. Thus, alternatively, a gate electrode can be deposited first, followed by a gate dielectric, then the semiconductor can be applied, and finally the contacts for the source electrode and drain electrode deposited on the semiconductor layer. A third structure could have the source and drain electrodes deposited first, then the semiconductor, with dielectric and gate electrode deposited on top.

The skilled artisan will recognize other structures can be constructed and/or intermediate surface modifying layers can be interposed between the above-described components of the thin film transistor. In most embodiments, a field effect transistor comprises an insulating layer, a gate electrode, a semiconductor layer comprising a ZnO material as described herein, a source electrode, and a drain electrode, wherein the insulating layer, the gate electrode, the semiconductor layer, the source electrode, and the drain electrode are in any sequence as long as the gate electrode and the semiconductor layer contact opposite sides of the insulating layer, and the source electrode and the drain electrode both contact the semiconductor layer.

A thin film transistor (TFT) is an active device, which is the building block for electronic circuits that switch and amplify electronic signals. Attractive TFT device characteristics include a low voltage to turn it on, a high transconductance or (device current)/(gate) control-voltage ratio, and a high 'on' ($Vg>0$) current to 'off' ($Vg \leq 0$) current ratio. In one embodiment of a typical TFT structure made according to the present invention, the substrate is a polymer, such as PET, PEN, KAPTON or the like. Source and drain conducting electrodes can be patterned on the substrate. The zinc-oxide-based semiconductor is then coated, followed by a gate-insulating layer such as $SiO_2$ or $Al_2O_3$ or a solution coated polymer. Finally, a gate-conducting electrode is deposited on the gate-insulating layer. One of skill in the art will recognize that this is one of many possible TFT fabrication schemes.

In the operation of such a TFT device, a voltage applied between the source and drain electrodes establishes a substantial current flow only when the control gate electrode is energized. That is, the flow of current between the source and drain electrodes is modulated or controlled by the bias voltage applied to the gate electrode. The relationship between material and device parameters of the zinc-oxide-based semiconductor TFT can be expressed by the approximate equation (see Sze in *Semiconductor Devices—Physics and Technology*, John Wiley & Sons (1981)):

$$I_d = \frac{W}{2L}\mu C(V_g - V_{th})^2$$

where $I_d$ is the saturation source-drain current, C is the geometric gate capacitance, associated with the insulating layer, W and L are physical device dimensions, μ is the carrier (hole or electron) mobility in the zinc-oxide-based semiconductor, and $V_g$ is the applied gate voltage, and $V_{th}$ is the threshold voltage. Ideally, the TFT allows passage of current only when a gate voltage of appropriate polarity is applied. However, with zero gate voltage, the "off" current between source and drain will depend on the intrinsic conductivity σ of the zinc-oxide-based semiconductor, $$\sigma = nq\mu$$

where n is the charge carrier density and q is the charge, so that $$(I_{sd}) = \sigma(Wt/L)V_{sd}@Vg=0$$

wherein t is the zinc-oxide-based semiconductor layer thickness and $V_{sd}$ is the voltage applied between source and drain. Therefore, for the TFT to operate as a good electronic switch, e.g. in a display, with a high on/off current ratio, the semiconductor needs to have high carrier mobility but very small intrinsic conductivity, or equivalently, a low charge carrier density. On/off ratios >$10^4$ are desirable for practical devices.

The TFT structure described herein includes a transparent zinc-oxide-based semiconductor with conducting electrodes, commonly referred to as a source and a drain, for injecting a current into the zinc-oxide-based semiconductor and a capacitance charge injection scheme for controlling and/or modulating the source-drain current. One particularly attractive application of zinc-oxide-based semiconductor TFT's is in the drive circuits for displays on flexible, polymer substrates. Zinc oxide semiconductor transistors and/or transistor arrays are useful in applications including, but not limited to, flat panel displays, active matrix imagers, sensors, rf price labels, electronic paper systems, rf identification tags and rf inventory tags.

For ease of understanding, the following terms used herein are described below in more detail:

"Enhancement-mode transistor" means a transistor in which there is negligible off-current flow, relative to on-current flow, between a source and a drain at zero gate voltage. In other words, the transistor device is "normally off." In contrast, a depletion-mode transistor is "normally on" meaning that more than a substantially negligible current flows between a source and a drain at zero gate voltage. Enhancement is typically preferred.

"Gate" generally refers to the insulated gate terminal of a three terminal FET when used in the context of a transistor circuit configuration.

"Substantially transparent" generally denotes a material or construct that does not absorb a substantial amount of light in the visible portion (and/or infrared portion in certain variants) of the electromagnetic spectrum.

As used herein, "a" or "an" or "the" are used interchangeably with "at least one," to mean "one or more" of the element being modified.

As used herein, the terms "over," "above," and "under" and the like, with respect to layers in the thin film transistor, refer to the order of the layers, wherein the thin film semiconductor layer is above the gate electrode, but do not necessarily indicate that the layers are immediately adjacent or that there are no intermediate layers.

In the descriptions of FIGS. 1 to 4, the descriptors "top" and "bottom" refer to the disposition of the contact with respect to the semiconductor, with bottom representing closer to the substrate and top representing further from the substrate. These structures will be described further.

"Vertical" means substantially perpendicular to the surface of a substrate.

The preceding term descriptions are provided solely to aid the reader, and should not be construed to have a scope less than that understood by a person of ordinary skill in the art or as limiting the scope of the appended claims.

Disclosed herein are enhancement-mode, field effect transistors wherein at least a portion of the transistor structure may be substantially transparent. Devices that include the transistors and methods for making the transistors are also disclosed.

Zinc-oxide materials can be made into substantially transparent films. Accordingly, an optional characteristic of a transistor structure according to the present invention is that selected embodiments of the construct, or a subset thereof that include the semiconductor channel layer and the gate insulator layer, may exhibit an optical transmission of at least about 90%, more particularly at least about 95%, across the visible portion (and/or infrared portion in certain variants) of the electromagnetic spectrum. Each of the additional components of the structure (i.e., substrate, gate electrode, source/drain terminals) may be optionally opaque or substantially transparent depending upon the desired end use of the transistor. In certain embodiments, the transistor structure as a whole (and/or individual components of the transistor) may exhibit an optical transmission of at least about 50%, more particularly at least about 70%, and most particularly at least about 90%, across the visible portion (and/or infrared portion in certain variants) of the electromagnetic spectrum.

Because of the optional transparency, transistors made according to the present invention may be advantageously included in optoelectronic display devices as switches coupled to at least one display element, as described in greater detail below.

A further feature of the FET disclosed herein is that it may easily be fabricated as a thin film transistor (TFT) at relatively low processing temperatures (e.g., preferably not exceeding about 300° C.).

Figure 2:
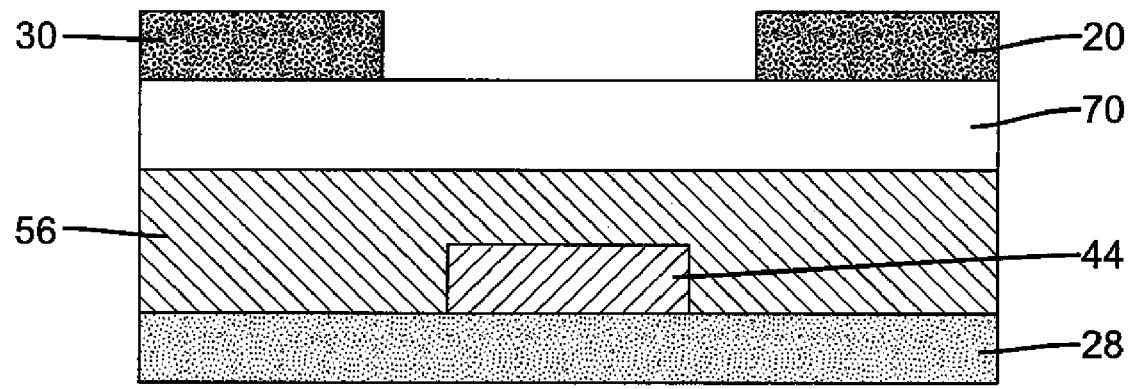
FIG. 2 illustrates a cross-sectional view of a typical thin film transistor having a bottom-gate/top-contact configuration.

Cross-sectional views of typical solution deposited thin film transistor are shown in FIGS. 1 to 4. For example, FIG. 1 illustrates a typical bottom contact configuration, and FIG. 2 illustrates a typical top contact configuration.

Each thin film transistor (TFT) in the embodiments of FIGS. 1 and 2 contains a source electrode 20, a drain electrode 30, a gate electrode 44, a gate dielectric 56, a substrate 28, and the semiconductor 70 of the invention in the form of a film connecting the source electrode 20 to drain electrode 30. When the TFT operates in an enhancement-mode, the charges injected from the source electrode into the semiconductor are mobile and a current flows from source to drain, mainly in a thin channel region within about 100 Angstroms of the semiconductor-dielectric interface. See A. Dodabalapur, L. Torsi H. E. Katz, *Science* 1995, 268, 270, hereby incorporated by reference. In the configuration of FIG. 1, the charge need only be injected laterally from the source electrode 20 to form the channel. In the absence of a gate field the channel ideally has few charge carriers; as a result there is ideally no source-drain conduction when the device is in off mode.

The off current is defined as the current flowing between the source electrode 20 and the drain electrode 30 when charge has not been intentionally injected into the channel by the application of a gate voltage. This occurs for a gate-source voltage more negative, assuming an n-channel, than a certain voltage known as the threshold voltage. See Sze in *Semiconductor Devices—Physics and Technology*, John Wiley & Sons (1981), pages 438-443. The on current is defined as the current flowing between the source electrode 20 and the drain electrode 30 when charge carriers have been accumulated intentionally in the channel by application of an appropriate voltage to the gate electrode 44, and the channel is conducting. For an n-channel accumulation-mode TFT, this occurs at gate-source voltage more positive than the threshold voltage. It is desirable for this threshold voltage to be zero, or slightly positive, for n-channel operation. Switching between on and off is accomplished by the application and removal of an electric field from the gate electrode 44 across the gate dielectric 56 to the semiconductor-dielectric interface, effectively charging a capacitor.

Figure 3:
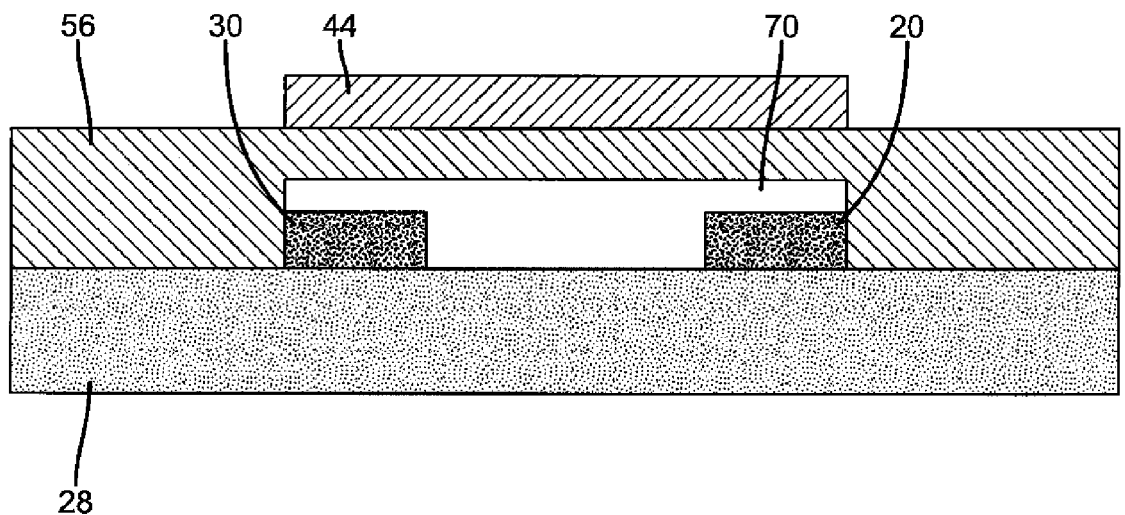
FIG. 3 illustrates a cross-sectional view of a typical thin film transistor having a top-gate/bottom-contact structure.

The specific examples of transistor configurations described herein are for illustrative purposes and should not be considered as limiting the scope of the appended claims. For example, a further (third) specific transistor structure is shown in FIG. 3, in which a third variation of a TFT structure includes an insulating substrate 28 upon which is disposed a source electrode 20 and a drain electrode 30. A semiconductor film 70 is provided such that contact between the source and drain electrodes is made. A gate electrode 44 is disposed on the top surface (from a vertical perspective) of the gate dielectric 56. In other words, the gate electrode 44 and the semiconductor film 70 are provided on opposing surfaces of the gate dielectric 56.

The TFT structure of FIG. 3 may be fabricated, for example, by depositing and patterning a film that defines the source electrode 20 and the drain electrode 30. For instance, a 500 Angstrom ITO source/drain electrode film may be sputtered onto the glass substrate 28. The source and drain patterning may be accomplished via shadow masking or photolithography. The source/drain electrode film could optionally be annealed. The semiconductor film 70 may then be deposited and patterned over the source electrode 20, the drain electrode 30, and the substrate 28. For example, a ZnO-based film may be deposited, and then patterned via photolithography or solution patterning during deposition.

Subsequently, the gate dielectric 56 may then be deposited and patterned over the semiconductor film 70. For example, a 2000-Angstrom $Al_2O_3$ film may be sputter deposited, and then patterned via shadow masking or photolithography. Vias (not shown) may be formed through the gate dielectric 56 to electrically connect to the source electrode 20 and the drain electrode 30. The $Al_2O_3$ film could optionally be annealed. The gate electrode 44 may then be deposited and patterned over the gate dielectric 56. For example, a 2000 Angstrom ITO film may be sputter deposited, and then patterned via shadow masking or photolithography. The ITO film could optionally be annealed.

Figure 4:
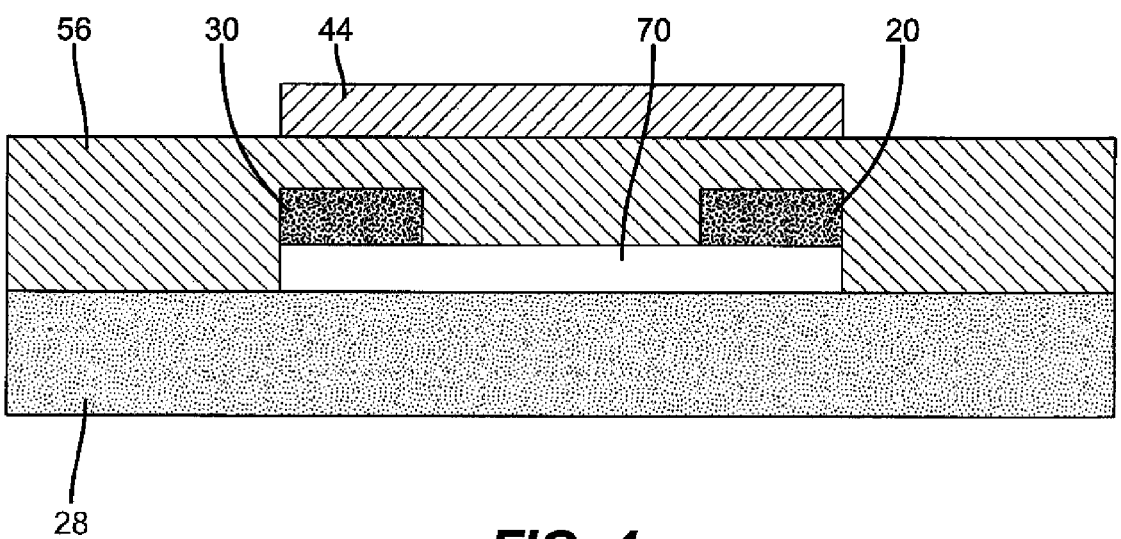
FIG. 4 illustrates a cross-sectional view of a typical thin film transistor having a top-gate/top-contact structure.

Yet a fourth variation of a TFT structure is shown in FIG. 4. This TFT structure includes a substrate 28 upon which is disposed a semiconductor channel layer 70. A source electrode 20 and a drain electrode 30 are provided on a surface of the semiconductor channel layer 70 opposing the surface that is adjacent to the glass substrate 28. A gate dielectric 56 is disposed over the semiconductor channel layer 70, the source electrode 20, and the drain electrode 30. A gate electrode 44 is disposed on the top surface (from a vertical perspective) of the gate dielectric 56. In other words, the gate electrode 44 and the semiconductor channel layer 70 are provided on opposing surfaces of the gate dielectric 56.

The TFT structure of FIG. 4 may be fabricated, for example, by the deposition and patterning of a film that defines the semiconductor channel layer 70. For instance, a 500-Angstrom ZnO-based film may be deposited, and patterned via photolithography, or selectively deposited by a solution process. The source electrode 20 and the drain electrode 30 may then be deposited and patterned. For example, a 500-Angstrom Aluminum or Silver, or other metal source/drain electrode film may be deposited by solution deposition in the desired pattern. Subsequently, the gate dielectric 56 may then be deposited and patterned over the semiconductor channel layer 70, the source electrode 20, and the drain electrode 30. For example, a 2000 Angstrom dielectric may be deposited and patterned or selectively deposited. Vias (not shown) may be formed through the gate dielectric 56 to electrically connect to the source electrode 20 and the drain electrode 30. The gate electrode 44 may then be deposited and patterned over the gate dielectric 56. For example, a 2000 Angstrom ITO or metal film may be deposited and/or patterned.

Alternatively, the contacts in the above configuration of FIG. 4 may be made by selectively doping the ends of the semiconductor channel layer with In, Al, Ga, or any other suitable n-type dopant.

Having illustrated and described the principles of the disclosed TFT transistor devices and methods with reference to several embodiments, it should be apparent that these TFT devices and methods may be modified in arrangement and detail without departing from such principles.

A support can be used for supporting the TFT during manufacturing, testing, and/or use. The skilled artisan will appreciate that a support selected for commercial embodiments may be different from one selected for testing or screening various embodiments. In some embodiments, the support does not provide any necessary electrical function for the TFT. This type of support is termed a "non-participating support" in this document. Useful materials can include organic or inorganic materials. For example, the support may comprise inorganic glasses, ceramic foils, polymeric materials, filled polymeric materials, coated metallic foils, acrylics, epoxies, polyamides, polycarbonates, polyimides, polyketones, poly(oxy-1,4-phenyleneoxy-1,4-phenylenecarbonyl-1,4-phenylene) (sometimes referred to as poly(ether ether ketone) or PEEK), polynorbornenes, polyphenyleneoxides, poly(ethylene naphthalenedicarboxylate) (PEN), poly(ethylene terephthalate) (PET), poly(ether sulfone) (PES), poly(phenylene sulfide) (PPS), and fiber-reinforced plastics (FRP). Flexible substrates can also be thin metal foils such as stainless steel provided they are coated with an insulating layer to electrically isolate the thin film transistor.

A flexible support is used in some embodiments of the present invention. This allows for roll processing, which may be continuous, providing economy of scale and economy of manufacturing over flat and/or rigid supports. The flexible support chosen preferably is capable of wrapping around the circumference of a cylinder of less than about 50 cm diameter, more preferably 25 cm diameter, most preferably 10 cm diameter, without distorting or breaking, using low force as by unaided hands. The preferred flexible support may be rolled upon itself.

If flexibility is not a concern, then the substrate may be a wafer or sheet made of materials including glass and silicon.

The thickness of the substrate may vary, and according to particular examples it can range from about 100 μm to about 1 cm.

In some embodiments of the invention, the support is optional. For example, in a top construction as in FIG. 2, when the gate electrode and/or gate dielectric provides sufficient support for the intended use of the resultant TFT, the support is not required. In addition, the support may be combined with a temporary support. In such an embodiment, a support may be detachably adhered or mechanically affixed to the support, such as when the support is desired for a temporary purpose, e.g., manufacturing, transport, testing, and/or storage. For example, a flexible polymeric support may be adhered to a rigid glass support, from which support could be removed.

The gate electrode can be any useful conductive material. A variety of gate materials known in the art, are also suitable, including metals, degenerately doped semiconductors, conducting polymers, and printable materials such as carbon ink, silver-epoxy, or sinterable metal nanoparticle suspensions. For example, the gate electrode may comprise doped silicon, or a metal, such as aluminum, chromium, gold, silver, nickel, copper, tungsten, palladium, platinum, tantalum, and titanium. Gate electrode materials can also include transparent conductors such as indium-tin oxide (ITO), ZnO, $SnO_2$, or $In_2O_3$. Conductive polymers also can be used, for example polyaniline, poly(3,4-ethylenedioxythiophene)/poly(styrene sulfonate) (PEDOT:PSS). In addition, alloys, combinations, and multilayers of these materials may be useful.

The thickness of the gate electrode may vary, and according to particular examples it can range from about 50 to about 1000 nm. The gate electrode may be introduced into the structure by chemical vapor deposition, sputtering, evaporation and/or doping, or solution processing.

In some embodiments of the invention, the same material can provide the gate electrode function and also provide the support function of the support. For example, doped silicon can function as the gate electrode and support the TFT.

The gate dielectric is provided in contact with the gate electrode. This gate dielectric electrically insulates the gate electrode from the balance of the TFT device. Thus, the gate dielectric comprises an electrically insulating material. The gate dielectric should have a suitable dielectric constant that can vary widely depending on the particular device and circumstance of use. For example, a dielectric constant from about 2 to 100 or even higher is known for a gate dielectric. Useful materials for the gate dielectric may comprise, for example, an inorganic electrically insulating material. The gate dielectric may comprise a polymeric material, such as polyvinylidenedifluoride (PVDF), cyanocelluloses, polyimides, etc. The gate electric may comprise a plurality of layers of different materials having different dielectric constants.

Specific examples of materials useful for the gate dielectric include strontiates, tantalates, titanates, zirconates, aluminum oxides, silicon oxides, tantalum oxides, titanium oxides, silicon nitrides, barium titanate, barium strontium titanate, barium zirconate titanate, zinc selenide, and zinc sulfide. In addition, alloys, combinations, and multilayers of these examples can be used for the gate dielectric. Of these materials, aluminum oxides, silicon oxides, and zinc selenide are preferred. In addition, polymeric materials such as polyimides, polyvinyl alcohol, poly(4-vinylphenol), polyimide, and poly(vinylidene fluoride), polystyrene and substituted derivatives thereof, poly(vinyl naphthalene) and substituted derivatives, and poly(methyl methacrylate) and other insulators having a suitable dielectric constant.

The gate dielectric can be provided in the TFT as a separate layer, or formed on the gate such as by oxidizing the gate material to form the gate dielectric. The dielectric layer may comprise two or more layers having different dielectric constants. Such insulators are discussed in U.S. Pat. No. 5,981,970 hereby incorporated by reference and copending U.S. application Ser. No. 11/088,645, hereby incorporated by reference. Gate insulator materials typically exhibit a band-gap of greater than about 5 eV.

The thickness of the gate insulator layer may vary, and according to particular examples it can range from about 10 to about 300 nm. The gate dielectric layer may be introduced into the structure by techniques such as chemical vapor deposition, sputtering, atomic layer deposition, or evaporation, solution.

Source/drain terminals refer to the terminals of a TFT, between which conduction occurs under the influence of an electric field. Designers often designate a particular source/drain terminal to be a "source" or a "drain" on the basis of the voltage to be applied to that terminal when the TFT is operated in a circuit.

The source electrode and drain electrode are separated from the gate electrode by at least the gate dielectric, while the zinc-oxide-based semiconductor layer can be over or under the source electrode and drain electrode. The source and drain electrodes can be any useful conductive material. Useful materials include most of those materials described above for the gate electrode, for example, aluminum, barium, calcium, chromium, gold, silver, nickel, palladium, platinum, titanium, copper, tungsten, polyaniline, PEDOT:PSS, other conducting polymers, alloys thereof, combinations thereof, and multilayers thereof. Other illustrative materials include transparent, n-type conductors such as indium-tin oxide (ITO), ZnO, $SnO_2$, or $In_2O_3$. Preferred electrodes are silver, gold, PEDOT:PSS, or aluminum.

The source electrode and drain electrode can be provided by any useful means such as chemical or physical vapor deposition (e.g., thermal evaporation, sputtering), evaporation, ink jet printing, or doping of the semiconductor channel layer material via diffusion or ion implantation and solution deposition. The patterning of these electrodes can be accomplished by known methods such as shadow masking, additive photolithography, subtractive photolithography, printing, microcontact printing, and pattern coating. The source and drain terminals may be fabricated such that they are geometrically symmetrical or non-symmetrical.

Electrical contact to the gate electrode, source, drain and substrate may be provided in any manner. For example, metal lines, traces, wires, interconnects, conductors, signal paths and signaling mediums may be used for providing the desired electrical connections. The related terms listed above, are generally interchangeable, and appear in order from specific to general. Metal lines, generally aluminum (Al), copper (Cu) or an alloy of Al and Cu, are typical conductors that provide signal paths for coupling or interconnecting, electrical circuitry. Conductors other than metal may also be utilized.

In cases where another layer covers the electrical contact of interest, connection to the electrical contact can be made by creating a "via" that penetrates to the contact. Such vias can be made by convenient patterning operations such as lithography, etching, or laser based processes.

An illustrative n-channel operation of the transistor involves applying a positive voltage to the gate electrode, grounding the source, and applying a positive voltage to the drain. For example, a voltage of about 5 to about 40 V may be applied to the gate electrode and the drain during operation. The threshold voltage may range from about −minus 10 to about 20 V, although devices can operate with larger ranges. Electrons flow from the source, along the semiconductor thin film, and out of the transistor through the drain. The effective mobility of the electrons may vary depending upon the specific structure, but typically should be greater than 0.01 cm$^2$ V$^{-1}$s$^{-1}$ for useful practical applications. Simply by removing the positive voltage applied to the gate electrode turns the transistor off when the transistor is an enhancement-mode transistor.

Devices in which the n-channel semiconductor films of the invention are useful include especially thin film transistors (TFTs). Also, such films can be used in various types of devices having p-n junctions, such as described on pages 13 to 15 of US 2004/0021204 A1 to Liu, hereby incorporated by reference.

Electronic devices in which TFTs and other devices are useful include, for example, more complex circuits, e.g., shift registers, integrated circuits, logic circuits, smart cards, memory devices, radio-frequency identification tags, backplanes for active matrix displays, active-matrix displays (e.g. liquid crystal or OLED), solar cells, ring oscillators, and complementary circuits, such as inverter circuits, for example, in combination with other transistors made using available p-type organic semiconductor materials such as pentacene. In an active matrix display, a transistor according to the present invention can be used as part of voltage hold circuitry of a pixel of the display. In devices containing the TFTs of the present invention, such TFTs are operatively connected by means known in the art.

One example of a microelectronic device is an active-matrix liquid-crystal display (AMLCD). One such device is an optoelectronic display that includes elements having electrodes and an electro-optical material disposed between the electrodes. A connection electrode of the transparent transistor may be connected to an electrode of the display element, while the switching element and the display element overlap one another at least partly. An optoelectronic display element is here understood to be a display element whose optical properties change under the influence of an electrical quantity such as current or voltage such as, for example, an element usually referred to as liquid crystal display (LCD). The presently detailed transistor has sufficient current carrying capacity for switching the display element at such a high frequency that the use of the transistor as a switching element in a liquid crystal display is possible. The display element acts in electrical terms as a capacitor that is charged or discharged by the accompanying transistor. The optoelectronic display device may include many display elements each with its own transistor, for example, arranged in a matrix. Certain active matrix pixel designs, especially those supplying a display effect that is current driven, may require several transistors and other electrical components in the pixel circuit.

Figure 5:
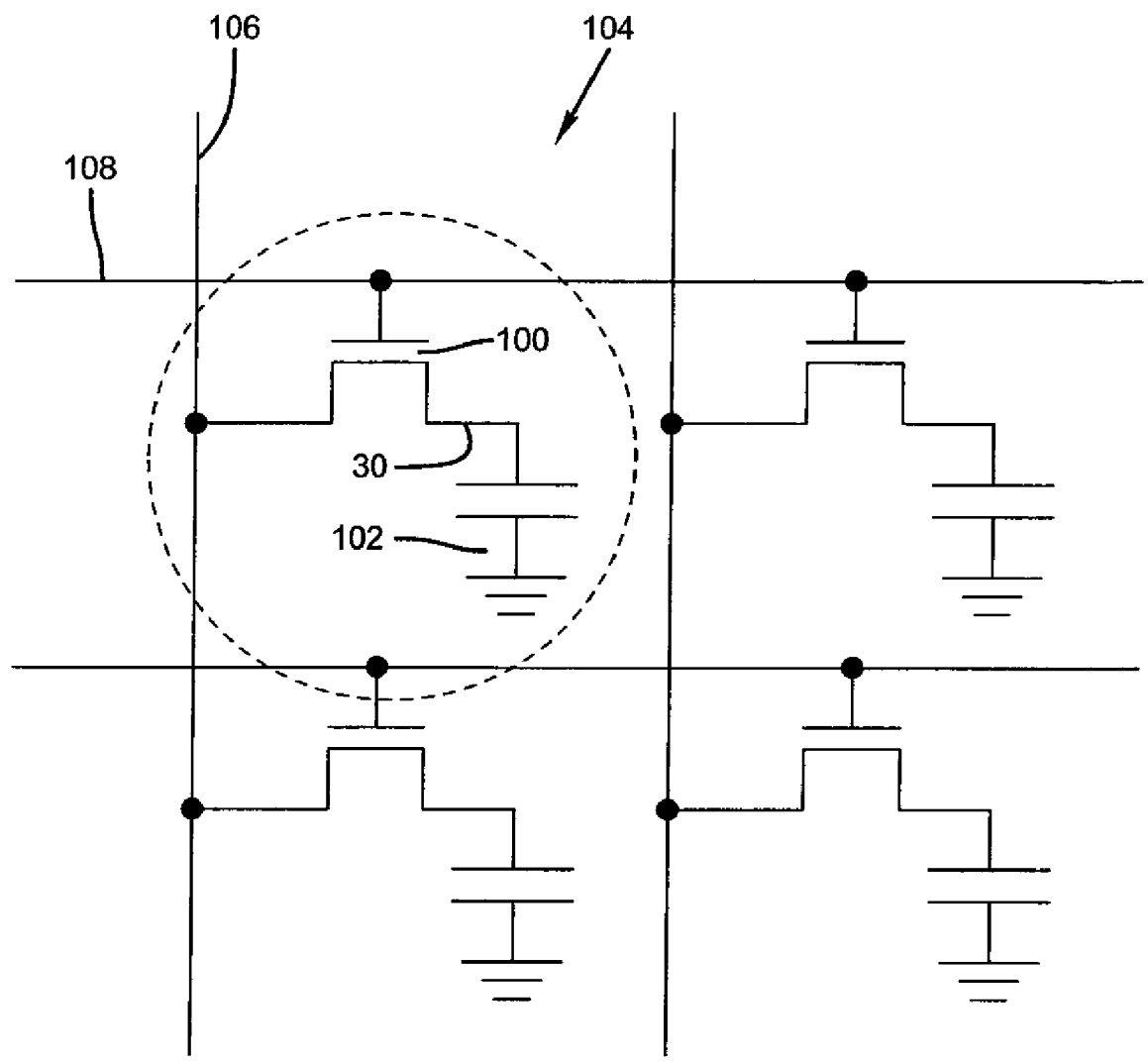
FIG. 5 illustrates a typical active matrix pixel design comprising a select transistor and capacitor representing the capacitance due to display design.

One specific example of a basic AMLCD cell circuit is depicted in FIG. 5. The AMLCD cell circuit includes a transistor 100 as presently described, and a LCD pixel 102 electrically coupled thereto. The transistor 100 and the LCD pixel 102 together form a transistor/pixel cell 104. In the arrangement shown, the transistor 100 is electrically coupled to the LCD pixel 102 via the drain electrode 30. The gate electrode of the transistor 100 is electrically coupled to a row or control line 108 (also referred to as a select or gate line) that receives on/off input for the transistor 100. The source electrode of the transistor 100 is electrically coupled to a column or data line 106 that receives a signal for controlling the LCD pixel 102. Each LCD pixel 102 can also be viewed as a capacitor representing the capacitance according to display design.

Figure 6:
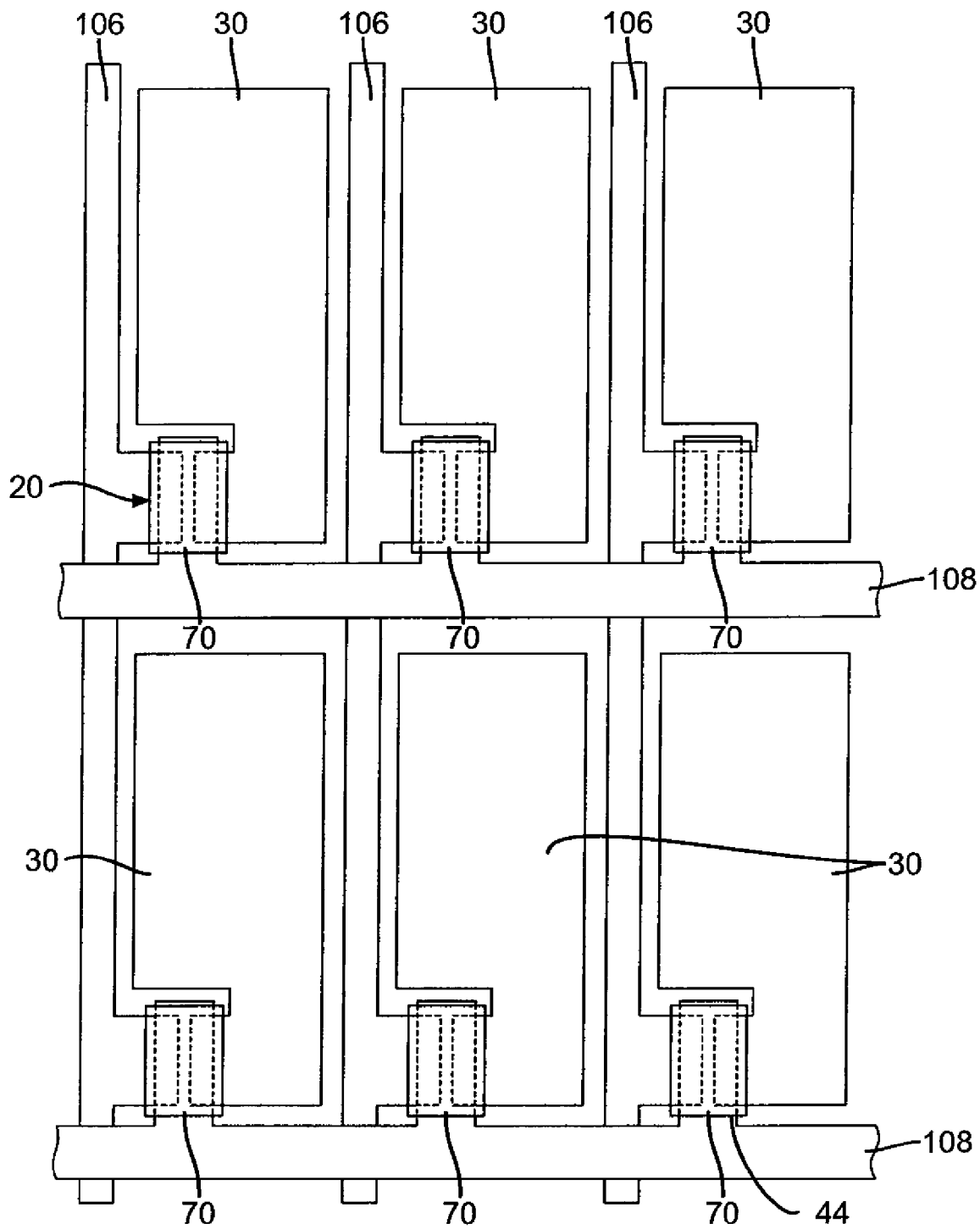
FIG. 6 illustrates a typical pixel layout comprising data lines, control lines, thin film transistors, and pixel conductor pads.

FIG. 6 shows a typical pixel layout in which data lines 106 lead to individual source electrodes 20, control lines 108 lead to individual gate electrodes 44, thin film transistors 70, and drain electrodes 30 each forming a pixel conductor pad.

Advantages of the invention will be demonstrated by the following examples, which are intended to be exemplary.

EXAMPLES

A. Material Synthesis

ZnO Seed Nanoparticle Layer Formulation SLF-1:

All reagents were obtained from the Aldrich Chemical Company. To a 40 mL amber glass bottle with screw cap was added 0.015 moles zinc acetate (99.99%) in 20 mL of methanol. With stirring, 270 µL of 18.5 MΩ water was added. The above solution was held, with stirring, at 60 C in a constant temperature water bath for 10 minutes.

A solution of 7.68 mL of 2.93M KOH in methanol plus 4.32 mL of methanol was then added drop wise, at a rate of 1 mL/minute, to the above solution at 60 C. Following the completion of the base addition, the solution is kept stirring at 60 C for 20 hours.

Following the completion of the reaction, 15 mL of the above solution were extracted and repeatedly washed by centrifugation followed by redispersion in methanol. The final wash consisted of redispersal in a solution of 1 part methanol and 3 parts hexanes, again followed by centrifugation. The final material was then redispersed in ethanol.

A typical sample of such a seed solution shows a primary particle size of approximately 80 nm as measured with UPA. The sample may also contain some particle aggregates of low number, leading to and apparent bimodal particle distribution. After washing, typical potassium content is less than a detection limit of less than 5 ppm as measured by inductively coupled plasma testing.

B. Device Preparation

All TFT's were made employing a gate and dielectric structure in a top contact structure (FIG. 2) consisting of a heavily doped n-type silicon (Gate) on which was grown a thermal oxide (dielectric) to a thickness of 1850 Å. Prior to deposition of the semiconductor layer on top of the thermal oxide, this substrate was washed for 10 minutes by treating with a solution of 70% sulfuric acid and 30% of a 30% solution of hydrogen peroxide maintained at approximately 100 C. After washing, the semiconductor layer was applied as shown in the following examples. After the semiconductor layer was applied, metal contacts representing the source and drain electrodes were formed from aluminum using vacuum evaporation through a shadow mask. Typical electrodes were of a size leading to a channel that was 480 microns wide by about 50 microns long although due to small channel length variations mobilities were calculated using individually measured channel lengths. Following contact evaporation, a passivation layer was applied by spin coating. A 2.5% solution of polystyrene in toluene was applied at a rate of 2500 rpm. Following the spin coating, samples were annealed at 60 C for 5 minutes in air to remove residual solvent. Devices were then tested for transistor activity as described below.

C. Device Measurement and Analysis

Electrical characterization of the fabricated devices was performed with a Hewlett Packard HP 4156 parameter analyzer. Device testing was done in air in a dark enclosure.

The results were averaged from several devices. For each device, the drain current (Id) was measured as a function of source-drain voltage (Vd) for various values of gate voltage (Vg). Furthermore, for each device the drain current was measured as a function of gate voltage for various values of source-drain voltage. For most devices, Vg was swept from −10 V to 40 V for each of the drain voltages measured, typically 5 V, 20 V, and 35 V, and 50 V. Mobility measurements were taken from the 35V sweep.

Parameters extracted from the data include field-effect mobility ($\mu$), threshold voltage (Vth), subthreshold slope (S), and the ratio of Ion/Ioff for the measured drain current. The field-effect mobility was extracted in the saturation region, where Vd>Vg−Vth. In this region, the drain current is given by the equation (see Sze in *Semiconductor Devices—Physics and Technology*, John Wiley & Sons (1981)):

$$I_d = \frac{W}{2L}\mu C_{ox}(V_g - V_{th})^2$$

where, W and L are the channel width and length, respectively, and $C_{ox}$ is the capacitance of the oxide layer, which is a function of oxide thickness and dielectric constant of the material. Given this equation, the saturation field-effect mobility was extracted from a straight-line fit to the linear portion of the $\sqrt{I_d}$ versus Vg curve. The threshold voltage, $V_{th}$, is the x-intercept of this straight-line fit.

The log of the drain current as a function of gate voltage was plotted. Parameters extracted from the log $I_d$ plot include the $I_{on}/I_{off}$ ratio. The $I_{on}/I_{off}$ ratio is simply the ratio of the maximum to minimum drain current, and S is the inverse of the slope of the $I_d$ curve in the region over which the drain current is increasing (i.e., the device is turning on).

EXAMPLE 1

A coating solution was prepared by diluting the above seed formulation, SLF-1, to 1.3% in ethanol. The above solution was applied to the substrate by spin coating at a rate of 2000 rpm. After the spin coating, the samples were annealed for 10 minutes at 200 C in dry air. Following the anneal, a precursor layer consisting of zinc acetate dissolved in methanol with concentrations in Samples 1-1 and 1-2 as listed below was spun on to the substrate at 2000 rpm. The methanol solutions can also contain trace levels of water This layer was then annealed at 200° C. for 10 minutes in dry air. After this process, aluminum contacts were applied by evaporation.

Following contact evaporation, a passivation layer was applied by spin coating. A 2.5% solution of polystyrene in toluene was applied at a rate of 2500 rpm. Following the spin coating, samples were annealed at 60° C. for 5 minutes in air to remove residual solvent. Devices were then tested for transistor activity as described above.

TABLE 1-1

| Sample | Precursor Overcoat Concentration | Extracted Mobility (cm²/Vs) |
| --- | --- | --- |
| 1-1 | 0.175M Zn—Ac | 0.15 |
| 1-2 | 0.0875M Zn—Ac | 0.17 |

The results in Table 1-1 show that high mobility ($\mu$>0.1) solution processed thin film transistors can be made from the precursor overcoat formulation.

EXAMPLE 2

Another coating solution was prepared by diluting the above-described seed formulation, SLF-1, to 1.3% in ethanol. The above solution was applied to the substrate by spin coating at a rate of 2000 rpm. After the spin coating, the samples were annealed for 10 minutes at 200° C. in dry air.

A first sample (2-1) did not receive any precursor overcoat and subsequent anneal. A second sample, 2-2, had the following treatment. A precursor layer consisting of zinc acetate dissolved in methanol at a concentration of 0.175M was spun on to the substrate at 2000 rpm. This layer was then annealed at 200 C for 10 minutes in dry air. After this process, Aluminum contacts were applied to both samples by evaporation.

Following contact evaporation, a passivation layer was applied by spin coating. A 2.5% solution of polystyrene in toluene was applied at a rate of 2500 rpm. Following the spin coating, samples were annealed at 60 C for 5 minutes in air to remove residual solvent. Devices were then tested for transistor activity, comparing nanoparticles alone to nanoparticles plus precursor overcoat. Table 2-1 shows the results:

TABLE 2-1

| Sample | Extracted Mobility (cm²/Vs) | Threshold position (V) |
| --- | --- | --- |
| 2-1 | 0.025 | 44.6 |
| 2-2 | 0.202 | 25.4 |

As can be seen in the above Table 2-1, the use of a solution applied precursor overcoat with a subsequent (second) anneal substantially improves the performance of the solution processed thin film transistor. The mobility is increased by a factor of approximately 8, the threshold position is moved to less positive voltage values which is desirable. Extending the first anneal does not substantially improve the performance of 2-1.

EXAMPLE 3

This example shows that the zinc oxide film can be applied by sequentially inkjet printing the ZnO seed nanoparticles and the precursor. Inkjet printing experiments were performed using a system consisting of a sample platen supported by a set of X-Y translation stages, piezoelectric demand-mode printheads supported by a z translation stage, and software to control these components. The printheads of this inkjet system are suited to dispense droplets in the 20-60 picoliter range. Approximately 2 cc of the fluid to be printed is placed in a sample cartridge that is then screwed to the printing fixture. The printhead is primed with ink using pressurized nitrogen. A TENCOR profilometer was used to measure the printed film thicknesses of a series of calibration samples. The drop volume was calculated as 38 picoliters by using best-fit linear regression in a simple model relating number of drops fired, ink concentration, and printed film thickness.

The inkjet printed ZnO nanoparticulate film was annealed at 200 C, followed by inkjet deposition of a zinc acetate solution.

Before depositing the aluminum contacts, a 0.175 molar zinc acetate solution in methanol was printed on top of the printed ZnO films. By overlaying drops at different drop spacing, the molar ratio of zinc acetate to zinc oxide varied from patch to patch. The samples were heated for 10 minutes at 200 C in air. Aluminum contacts were deposited by evaporation in a vacuum chamber. Film thickness and charge mobility results are summarized in Table 3-1. The overcoat thickness in Table 3-1 is based on complete conversion of zinc acetate to zinc oxide, and is calculated from the number of drops per printed area, drop volume, and the zinc acetate concentration.

TABLE 3-1

| Sample ID | ZnO seed thickness (nm) | Overcoat thickness (nm) | Total thickness (nm) | Mobility (cm$^2$/Vs) |
|---|---|---|---|---|
| 3-1 | 33.5 | 36.5 | 70 | 0.057 |
| 3-2 | 21.6 | 36.5 | 58.1 | 0.097 |
| 3-3 | 11 | 36.5 | 47.5 | 0.055 |
| 3-4 | 8.4 | 36.5 | 44.9 | 0.052 |
| 3-5 | 103 | 113 | 216 | 0.010 |
| 3-6 | 62 | 113 | 175 | 0.022 |
| 3-7 | 33.5 | 113 | 146.5 | 0.026 |
| 3-8 | 11 | 113 | 124 | 0.061 |
| 3-9 | 8.4 | 113 | 121.4 | 0.022 |
| 3-10 | 103 | 9.2 | 112.2 | 0.0097 |
| 3-11 | 62 | 9.2 | 71.2 | 0.026 |
| 3-12 | 33.5 | 9.2 | 42.7 | 0.062 |
| 3-13 | 21.6 | 9.2 | 30.8 | 0.079 |
| 3-14 | 11 | 9.2 | 20.2 | 0.041 |
| 3-15 | 8.4 | 9.2 | 17.6 | 0.042 |
| 3-16 | 103 | 23.5 | 126.5 | 0.0095 |
| 3-17 | 62 | 23.5 | 85.5 | 0.036 |
| 3-18 | 33.5 | 23.5 | 57 | 0.059 |
| 3-19 | 21.6 | 23.5 | 45.1 | 0.061 |
| 3-20 | 11 | 23.5 | 34.5 | 0.042 |
| 3-21 | 8.4 | 23.5 | 31.9 | 0.02 |

Comparative examples were prepared to shows the effect of not applying the precursor coating to the nanoparticle layer. A 30 mm square sample of a silicon wafer was cleaned according to the procedure described above and placed on the printer stage. A 3.31 wt % dispersion of charge stabilized Zinc-oxide-based nanoparticles was diluted with ethanol to 1.3 wt %, and an ink cartridge was filled with the resulting fluid. By overlaying drops at different drop spacing, a set of ZnO nanoparticle films with varying film thickness were obtained. The sample was heated for 10 minutes at 200 C in air. The converted ZnO film thickness was measured using TENCOR profilometer. Aluminum contacts and a polystyrene overcoat were deposited as described above. Film thickness and charge mobility results are summarized in Table 3-2 as comparison examples.

TABLE 3-2

| Sample ID | ZnO film thickness (nm) | Mol ZnAc/mol ZnO | Mobility (cm$^2$/Vs) |
|---|---|---|---|
| Comparative-1 | 6.4 | 0 | 0.0001 |
| Comparative-2a | 8.25 | 0 | 0.0018 |
| Comparative-2b | 8.25 | 0 | 0.0016 |
| Comparative-2c | 8.25 | 0 | 0.0005 |
| Comparative-3a | 11.7 | 0 | 0.002 |
| Comparative-3b | 11.7 | 0 | 0.0017 |
| Comparative-3c | 11.7 | 0 | 0.002 |
| Comparative-4a | 13.1 | 0 | 0.007 |
| Comparative-4b | 13.1 | 0 | 0.0065 |
| Comparative-4c | 13.1 | 0 | 0.003 |
| Comparative-4d | 13.1 | 0 | 0.003 |
| Comparative-5 | 21.6 | 0 | 0.007 |
| Comparative-6 | 33.5 | 0 | 0.008 |
| Comparative-7 | 41.5 | 0 | 0.005 |
| Comparative-8 | 62.8 | 0 | 0.005 |

Comparison of the charge mobilities between Tables 3-1 and 3-2 clearly show the superiority of using the zinc acetate precursor coating over the nanoparticle seed layer.

EXAMPLE 4

This Example shows the effect of reversing the order of the coatings. For the inventive sample, the coating solution was prepared by diluting the above seed formulation, SLF-1, to 1.1% in ethanol. The above solution was applied to the substrate by spin coating at a rate of 2000 rpm. After the spin coating, the samples were annealed for 10 minutes at 200° C. in dry air.

Following the annealing, a precursor layer consisting of 0.175M Zn—Ac in methanol was spun on to the substrate at 2000 rpm. This layer was then annealed at 200 C for 10 minutes in dry air. After this process, aluminum contacts were applied by evaporation.

The order of deposition was reversed for comparative Example C-4-1, as follows. First, a precursor layer consisting of 0.175M Zn—Ac in methanol was spun on to the substrate at 2000 rpm. This layer was then annealed at 200° C. for 10 minutes in dry air.

Following the anneal, the 1.1% SLF-1 solution as mentioned above was applied to the first layer by spin coating at a rate of 2000 rpm. After the spin coating, the samples were annealed for 10 minutes at 200° C. in dry air. Contacts were then applied as described above.

In a second comparison C-4-3 in Table 4-1, a second layer of seeds is also used in substitution for the Zn—Ac layer in order to demonstrate the importance of the precursor layer.

In a third comparison C-4-4 in Table 4-1, the Zn—Ac precursor alone replaced the combination of the nanoparticle seed layer and precursor layer. The precursor solution consisting of 0.175M Zn—Ac in methanol is applied to the substrate by spin coating at a rate of 2000 rpm. The sample is then annealed and contacts are applied as described above.

Following contact evaporation, a passivation layer was applied by spin coating. A 2.5% solution of polystyrene in toluene was applied at a rate of 2500 rpm. Following the spin coating, samples were annealed at 60° C. for 5 minutes in air to remove residual solvent. Devices were then tested for transistor activity, comparing order of layer deposition and also the role of the Zn—Ac precursor. Table 4-1 shows the results:

TABLE 4-1

| Sample | Order of Layer Deposition | Extracted Mobility (cm$^2$/Vs) |
|---|---|---|
| I-4-1 | 1. Seeds 2. Precursor | 0.114 cm$^2$/Vs |
| C-4-2 | 1. Precursor 2. Seeds | 0.0044 cm$^2$/Vs |
| C-4-3 | 1. Seeds 2. Seeds | 0.0085 cm$^2$/Vs |
| C-4-4 | 1. Zn—Ac | 0.0067 cm$^2$/Vs |

As seen in Table 4-1, the order of layer deposition is important, with a reversal leading to a drop in mobility by a factor of 25. In addition, the precursor solution in combination with the seeded layer leads to superior transistor performance.

| Parts List: | |
|---|---|
| 20 | source electrode |
| 28 | substrate |
| 30 | drain electrode |
| 44 | gate electrode |
| 56 | gate dielectric |
| 70 | semiconductor |
| 100 | transistor |
| 102 | LCD pixel |

-continued

Parts List:

| | |
|---|---|
| 104 | transistor/pixel cell |
| 106 | column or data line |
| 108 | row or control line |

The invention claimed is:

1. A method of making a zinc-oxide-based thin film semiconductor, for use in a transistor, comprising:
   (a) applying, to a substrate, a seed coating comprising a colloidal solution of zinc-oxide-based nanoparticles having an average primary particle size of 5 to 200 nm;
   (b) drying the seed coating to form a porous layer of zinc-oxide-based nanoparticles;
   (c) optionally annealing the porous layer of zinc-oxide-based nanoparticles at a temperature higher than the temperature of step (a) or (b);
   (d) applying, over the porous layer of nanoparticles, an overcoat solution comprising a soluble zinc-oxide-precursor compound that converts to zinc oxide upon annealing, to form an intermediate composite film layer;
   (e) drying the intermediate composite film layer; and
   (f) annealing the dried intermediate composite film at a temperature of at least 50° C. to produce a semiconductor film comprising zinc-oxide-based nanoparticles supplemented by additional zinc oxide material in a film layer formed by the conversion of the zinc-oxide-precursor compound during the annealing of the composite film.

2. The method according to claim 1, wherein the temperature of annealing in step (f) is about 130 to 300° C.

3. The method according to claim 1, wherein the semiconductor film is annealed in step (f) for about 10 seconds to about 10 minutes.

4. The method of claim 1 wherein the porous layer of nanoparticles is annealed in step (c) before applying the overcoat solution.

5. The method according to claim 1, wherein the semiconductor film is optionally annealed in step (c) and/or annealed in step (f) by a laser annealing.

6. The method of claim 1 wherein the colloidal solution of zinc-oxide-based nanoparticles is applied to the substrate at a first temperature and then annealed in step (c) at a higher temperature of 50 to 500° C., prior to applying the overcoat solution.

7. The method of claim 1 wherein the temperatures of the substrate during step (a) is 300° C. or less.

8. The method of claim 1 wherein the optional annealing in step (c) and the annealing in step (f) is in the presence of air under ambient conditions.

9. The method of claim 1 wherein the semiconductor film has a mobility that is substantially greater than that of the seed coating alone, if annealed without the overcoat solution.

10. The method of claim 1 wherein the semiconductor film is capable of exhibiting electron mobility greater than 0.01 $cm^2/Vs$.

11. The method of claim 1 wherein the semiconductor film exhibits a band-gap of less than about 5 eV.

12. The method of claim 1 wherein the zinc-oxide-based nanoparticles, upon heating, form a layer comprising a substantially transparent layer.

13. The method of claim 1 wherein the nanoparticles are comprised of undoped zinc oxide.

14. The method of claim 1, wherein the nanoparticles or the precursor solution comprises acceptor dopant.

15. The method of claim 1 wherein the nanoparticles are colloidally dispersed in an organic solvent.

16. The method of claim 1 wherein the seed coating is applied to the substrate at a level of 0.02 to 1 $g/m^2$ of nanoparticles, by dry-weight.

17. The method of claim 1 wherein the overcoat solution is applied at a level of $2\times 104$ to 0.01 $moles/m^2$ of precursor compound.

18. The method of claim 1 characterized by a molar ratio of nanoparticles, in the seed coating, to theoretically converted zinc-oxide precursor compound, in the overcoat solution, that ranges from 0.02 to 60.

19. The method of claim 1 wherein the seed coating, and/or the overcoat solution, are applied by an inkjet printer.

20. The method of claim 1 wherein the seed coating and/or the overcoat solution is applied by spin coating, extrusion coating, hopper coating, dip coating, or spray coating.

21. The method of claim 1 wherein patterned semiconductor thin films are coated on a web substrate.

22. The method of claim 1 wherein the semiconductor film is an active layer in a field effect transistor comprising a dielectric layer, a gate electrode, a source electrode and a drain electrode, and wherein the dielectric layer, the gate electrode, the semiconductor film, the source electrode, and the drain electrode are in any sequence as long as the gate electrode and the semiconductor film both contact the dielectric layer, and the source electrode and the drain electrode both contact the semiconductor film.

23. The method of claim 1 wherein the substrate comprises a dielectric layer made from an inorganic or organic electrically insulating material.

24. The method of claim 1 wherein the transistor further comprises a non-participating support that is optionally flexible.

25. The method of claim 1, for fabricating a thin film semiconductor device, comprising subsequent to step (f):
   (g) forming a spaced apart source electrode and drain electrode, wherein the source electrode and the drain electrode are separated by, and electrically connected with, the semiconductor film; and
   (h) forming a gate electrode spaced apart from the semiconductor film.

26. The method of claim 1 comprising, not necessarily in order, the following steps:
   (a) providing the substrate;
   (b) providing a gate electrode material over the substrate
   (c) providing a dielectric layer over the gate electrode material;
   (d) forming the semiconductor film over the gate dielectric; and
   (e) providing a source electrode and a drain electrode contiguous to the semiconductor film.

27. The method of claim 1 wherein the substrate is flexible.

28. The method of claim 1 wherein steps (a) through (f) are carried out in its entirety below a peak temperature of 150° C.

29. The method of claim 1 wherein the colloidally stable dispersion of zinc-oxide-based nanoparticles has been colloidally stabilized by charge in the absence of surfactant.

30. The method of claim 19 wherein the inkjet printer is a continuous or drop-on-demand inkjet printer.

31. The method of claim 22, wherein the gate electrode is adapted for controlling, by means of a voltage applied to the gate electrode, a current between the source and drain electrodes through the semiconductor film.

32. The method of claim 22, wherein the transistor has an on/off ratio of a source/drain current of at least 104.

33. The method of claim 22 wherein the transistor is configured for enhancement mode operation.

34. The method of claim 22 wherein the source, drain, and gate electrodes each independently comprise a material selected from doped silicon, metal, and conducting polymer.

35. The method of claim 22 wherein the source, drain, and gate electrode each comprise indium-tin oxide and the substrate comprises glass.

36. The method of claim 23 comprising depositing the seed coating onto at least a portion of a surface of the dielectric layer.

37. The method of claim 26 wherein the method further comprises step (f) wherein metal contacts are applied to the upper surface of the semiconductor film.

38. The method according to claim 36 wherein the dielectric layer comprises a substantially transparent material.

39. The method according to claim 36, further comprising depositing on the dielectric layer at least one material for forming a source and a drain prior to depositing the seed coating.

40. The method of claim 37 wherein the steps are performed in the order listed.

41. The method of claim 38 wherein the dielectric layer comprises $Al_2O_3/TiO_2$ or $Al_2O_3$.

42. The method according to claim 39, wherein the material for forming a source and a drain is ion beam sputtered deposited onto the dielectric layer, and annealing is employed to diffusion dope the semiconductor film with the source and drain material.

43. A method of inkjet printing a semiconductor film on a substrate element comprising carrying out the process of claim 1, further comprising:
  i) providing an inkjet printer that is responsive to digital data signals;
  ii) loading a first printhead with said seed coating;
  iii) in step (a), applying to the substrate, the seed coating by printing in response to the digital data signals;
  iv) loading a second printhead with said overcoat solution;
  v) in step (d), applying over the porous layer of nanoparticles, the overcoat solution by printing using in response to the digital data signals; and
  vi) in step (f) annealing the printed substrate.

44. A method of making a zinc-oxide-based thin film semiconductor, for use in a transistor, comprising:
  (a) applying, to a substrate, a seed coating comprising a colloidally stable dispersion of zinc-oxide-based nanoparticles having an average primary particle size of 5-200 nm;
  (b) drying the seed coating to form a porous layer of zinc-oxide-based nanoparticles;
  (c) optionally annealing the porous layer of zinc-oxide-based nanoparticles at a temperature higher than the temperature of step (a) or (b);
  (d) applying, over the porous layer of nanoparticles, an overcoat solution comprising a soluble zinc-oxide-precursor compound that converts to zinc oxide upon annealing, to form an intermediate composite film layer;
  (e) drying the intermediate composite film layer; and
  (f) annealing the dried intermediate composite film at a temperature of at least 50° C. to produce a semiconductor film comprising zinc-oxide-based nanoparticles supplemented by additional zinc oxide material formed by the conversion of the zinc-oxide-precursor compound during the annealing of the composite film layer,
  wherein the semiconductor film is an active layer in a field effect transistor comprising a dielectric layer, a gate electrode, a source electrode and a drain electrode, wherein the dielectric layer, the gate electrode, the seminconductor film, the source electrode, and the drain electrode are in any sequence as long as the gate electrode and the semiconductor film both contact the dielectric layer, and the source electrode and the drain electrode both contact t the seminconductor film, and wherein the entire process of making the semiconductor film is carried out below a maximum support temperature of 300° C.

* * * * *

UNITED STATES PATENT AND TRADEMARK OFFICE
CERTIFICATE OF CORRECTION

PATENT NO. : 7,691,666 B2  Page 1 of 1
APPLICATION NO. : 11/155436
DATED : April 6, 2010
INVENTOR(S) : David H. Levy et al.

It is certified that error appears in the above-identified patent and that said Letters Patent is hereby corrected as shown below:

| | |
|---|---|
| First Page<br>Col. 2, line 6<br>(Other Publications) | Delete "2075." and insert -- e2075. --, therefor. |
| Col. 22, line 9 | In Claim 17, delete "2×104" and insert -- $2 \times 10^4$ --, therefor. |
| Col. 23, line 2 | In Claim 32, delete "104." and insert -- $10^4$. --, therefor. |
| Col. 23, line 26 | In Claim 41, delete "A$_1$2O$_3$." and insert -- $Al_2O_3$. --, therefor. |
| Col. 24, line 2 | In Claim 43, after "printing" delete "using". |
| Col. 24, line 22-23 | In Claim 44, delete "seminconductor" and insert -- semiconductor --, therefor. |
| Col. 24, line 30-31 | In Claim 44, delete "seminconductor" and insert -- semiconductor --, therefor. |
| Col. 24, line 33 | In Claim 44, delete "seminconductor" and insert -- semiconductor --, therefor. |
| Col. 24, line 35 | In Claim 44, after "contact" delete "t". |
| Col. 24, line 35 | In Claim 44, delete "seminconductor" and insert -- semiconductor --, therefor. |

Signed and Sealed this

Fifteenth Day of June, 2010

David J. Kappos
*Director of the United States Patent and Trademark Office*